US006208185B1

(12) United States Patent
John et al.

(10) Patent No.: US 6,208,185 B1
(45) Date of Patent: Mar. 27, 2001

(54) HIGH PERFORMANCE ACTIVE GATE DRIVE FOR IGBTS

(75) Inventors: Vinod John, Madison, WI (US); Bum-Seok Suh, Seoul (KR); Thomas Anthony Lipo, Middleton, WI (US)

(73) Assignee: Wisconsin Alumni Research Corporation, Madison, WI (US)

( * ) Notice: Subject to any disclaimer, the term of this patent is extended or adjusted under 35 U.S.C. 154(b) by 0 days.

(21) Appl. No.: 09/276,417

(22) Filed: Mar. 25, 1999

(51) Int. Cl.[7] ............................... H03K 5/12; H03K 3/00
(52) U.S. Cl. ..................... 327/170; 327/434; 327/380; 327/389
(58) Field of Search ........................... 327/427, 432–437, 327/108, 109, 111, 112, 170, 134, 379–383, 389, 391

(56) References Cited

U.S. PATENT DOCUMENTS

| 4,779,013 | * | 10/1988 | Tanaka | 327/170 |
| 5,306,965 | * | 4/1994 | Asprey | 327/108 |
| 5,539,341 | * | 7/1996 | Kuo | 327/108 |
| 5,587,677 | * | 12/1996 | Samani | 327/108 |

OTHER PUBLICATIONS

F. Blaabjerg, et al., "An Optimum Drive and Clamp Circuit Design with Controlled Switching for a Snubberless PWM–VSI–IGBT inverter leg," IEEE PESC Conf. Rec., 1992, pp. 289–297.
R. Chokhawala, et al., "Gate Drive Considerations for IGBT Modules," IEEE IAS Conf. Rec., 1992, pp. 1186–1195, and IEEE Trans. Ind. App., vol. 31, No. 3, May/Jun. 1995, pp. 603–611.
H.G. Eckel, et al., "Optimization of the Turn–Off Performance of IGBT at Overcurrent and Short–Circuit Current," EPE Conf. Rec., 1993, pp. 317–322.

S. Musumeci, et al., "A New Adaptive Driving Technique for High Current Gate Controlled Devices," IEEE APEC Conf. Rec., 1994, pp. 480–486.
S. Gediga, et al., "High Power IGBT Converters with New Gate Drive and Protection Circuit," EPE Conf. Rec., 1995, pp. 66–70.
A.N. Githiari, et al., "High Performance Gate Drives Utilizing the IGBT in the Active Region," IEEE PESC Conf. Rec., 1996, pp. 1754–1759.
N. McNeill, et al., "Assessment of Negative Off–State Gate Voltage Requirements for IGBTs," IEEE PESC Conf. Rec., 1996, pp. 627–630.

(List continued on next page.)

Primary Examiner—Toan Tran
(74) Attorney, Agent, or Firm—Foley & Lardner

(57) ABSTRACT

An active drive circuit for high power IGBTs provides optimized switching performance for both turn-on and turn-off by incorporating a three-stage action to improve performance characteristics. The gate drive circuit includes a semiconductor switch such as a MOSFET connected in series with a low resistance gate turn-on resistor between the supply line and the gate input line, and a parallel connected bipolar transistor. During the first and third stages of turn-on, the MOSFET switch is turned on to provide rapid charging of the gate, whereas during the second stage the bipolar transistor is turned on to provide a controlled level of current charging of the gate. Similarly, a switch such as an MOSFET is connected in series with a low resistance gate turn-off resistor between the turn-off supply voltage line and the gate input line, and a bipolar transistor is connected in parallel therewith across the supply line and the gate input line. During the first and second stages of turn-off, the MOSFET switch is turned on to provide rapid discharging of the gate whereas during the second stage the bipolar transistor is turned on to provide a controlled level of discharge current from the gate.

47 Claims, 13 Drawing Sheets

OTHER PUBLICATIONS

M. Reddig, et al., "The Influence of the Base Resistance Modulation on Switching Losses in IGBTs," IEEE IAS Conf. Rec., 1996, pp. 1500–1506.

A. Lindberg, et al., "MACS ICON—IGBT Based Propulsion System," EPE Conf. Rec., 1997, pp. 3.492–3.497.

V. Venketashan, et al., "IGBT Turn–Off Characteristics Explained Through Measurements and Device Simulation," IEEE APEC Conf. Rec., 1997, pp. 175–178.

* cited by examiner

HIGH PERFORMANCE ACTIVE GATE DRIVE FOR IGBTS

This invention was made with United States government support awarded by the following agency: ONR Grant No. N00014-97-1-1010. The United States government has certain rights in this invention.

FIELD OF THE INVENTION

This invention pertains generally to the field of power electronics and particularly to gate drive circuits for semiconductor power switching devices.

BACKGROUND OF THE INVENTION

Insulated gate bipolar transistors (IGBTs) are finding increasing application, particularly in the field of high power converters. In a typical power converter a gate drive circuit is required as an interface between the logic level signals of the modulator and the IGBT power switches. The design of the gate drive circuit can significantly affect the performance of the IGBT or other power semiconductor device. Ideally, the gate drive circuit should switch the IGBT at a high speed while limiting di/dt and dv/dt and associated noise that is generated during the switching transient. At the same time, it is desirable that the gate drive function to minimize switching losses, the peak reverse recovery current stress during turn-on, and the peak over-voltage stress at turn-off. These diverse functional objectives for the gate drive have been difficult to implement in conventional gate drive circuits. Typical conventional IGBT gate drive circuits have employed fixed gate resistors which are selected to suppress switching electromagnetic interference (EMI) to an acceptable level, and to limit the reverse recovery current at turn-on and the over-voltage at turn-off with minimal energy loss. However, because these objectives are to some extent conflicting, the compromises required have led to less than optimal performance. To satisfy the switching stress constraints and to keep EMI at acceptable levels, the required value of the gate resistor must be relatively large, which leads to long switching delays and higher switching losses, a sacrifice in performance that has been necessary to achieve acceptable noise levels and switching stresses.

Several studies have been made of the optimal choice of the values for the turn-off and turn-on gate resistors with an aim to limiting the turn-on di/dt and the turn-off over-voltage and dv/dt. See, e.g., F. Blaabjerg, et al., "An Optimum Drive and Clamp Circuit Design with Controlled Switching for a Snubberless PWM-VSI-IGBT Inverter Leg," IEEE PESC. Conf. Rec., 1992, pp. 289–297; R. Chokhawala, et al., "Gate Drive Considerations for IGBT Modules," IEEE IAS Conf. Rec., 1992, pp. 1186–1195. The use of multiple gate resistors to control the over-voltage during turn-off switching transients at over-current levels has also been investigated. H.G. Eckel, et al., "Optimization of the Turn-Off Performance of IGBT at Over-Current and Short-Circuit Current," EPE Conf. Rec., 1993, pp. 317–322. This study was limited to turn-off operation only, with an indication that it was difficult to obtain optimized switching characteristics between the over-voltage and the turn-off energy loss at nominal current levels. Investigations have been made of the use of a gate circuit with a closed loop high speed operational amplifier to operate the IGBT in the active region at turn-off. A.N. Githiari, et al., "High Performance Gate Drives Utilizing the IGBT in the Active Region," IEEE PESC Conf. Rec., 1996, pp. 1754–1759. Using this approach, the turn-off dv/dt can be precisely controlled in accordance with the reference voltage command. The problem with this approach is the large switching loss at turn-off and the fact that the circuit cannot easily be extended to turn-on operation under an inductive load switching transient. A technique for reducing the power loss at turn-on by injecting additional current into the gate is discussed in S. Musumeci, et al., "A New Adaptive Driving Technique for High Current Gate Control Devices," IEEE APEC Conf. Rec., 1994, pp. 480–486. This method uses a phase-lock-loop to determine the instant of current injection into the gate of the device, which can result in poor operation under transient load current conditions. In addition, the update of the control information occurs with one switching period delay, and the total turn-on delay time is still quite large because a fixed gate resistor is used to limit the di/dt during turn-on.

The use of a high performance current source gate drive used in a modular traction converter is described in A. Lindberg, "MACS ICON-IGBT Propulsion System," EPE Conf. Rec., 1997, pp. 3.492–3.497. The paper by S. Gediga, et al., "High Power IGBT Converters with New Gate Drive and Protection Circuit," EPE Conf. Rec., 1995, pp. 66–70, reports on the use of a high performance gate drive for high power IGBT converter applications. This gate drive is based on open loop methods for reduced turn-on di/dt operation with predetermined control points. Turn-off is controlled by using closed loop measurement of the collector voltage which is used to limit the over-voltages for the series-connected IGBTs.

SUMMARY OF THE INVENTION

In accordance with the present invention, an active drive circuit for driving high power IGBTs provides optimized switching performance for both turn-on and turn-off and for all operating conditions. The active gate drive circuit incorporates a three-stage action to improve performance characteristics, including reduced delay time at both turn-on and turn-off, reduced turn-on di/dt and reduction of the associated reverse recovery effects, lower tail voltage and thus lower resultant energy loss at turn-on, controlled over-voltage at turn-off, reduced energy loss due to improved dv/dt characteristics at turn-off, and reduced total switching time at both turn-on and turn-off.

For turn-on of the IGBT, the gate drive circuit of the invention includes a means for providing low resistance rapid charging of the gate during a first stage after receipt of the turn-on signal, a means for providing controlled current charging of the gate during a second stage that follows the first stage, and a means for providing rapid low resistance final charging of the gate to a turn-on voltage supply level during a third stage that follows the second stage and for maintaining the turn-on supply voltage level at the gate while the turn-on signal is present. The first stage minimizes the delay time by rapidly charging the IGBT gate with a large gate current. Once the gate voltage has reached the threshold gate voltage level, the second stage is initiated. During the second stage, control of the turn-on di/dt is achieved by a reduced rate of charging of the gate based on control of the current supplied to the gate. The second stage continues until the collector current reaches the load current plus the peak reverse recovery current. The level of current injected into the gate during the second stage is less than that during a comparable period for a conventional gate drive, thus minimizing the effects of the reverse recovery current on the converter system. Finally, in the third stage, the gate is rapidly charged to reduce the tail voltage, thus decreasing the power loss during turn-on.

A gate drive circuit in accordance with the invention for turning off the IGBT includes a means for providing low resistance rapid discharging of the gate during a first stage after receipt of a turn-off signal, a means for providing controlled current discharging of the gate during a second stage that follows the first stage, and a means for providing rapid low resistance final discharging of the gate to a turn-off voltage supply level during a third stage that follows the second stage and for maintaining the turn-off voltage level at the gate while the turn-off signal is present. The first stage may continue until the rising instant of the collector voltage. The rapid discharging during the first stage considerably reduces both the turn-off delay time and the power loss caused by the slow initial rise of the collector voltage encountered with conventional gate drives. The large gate current during the first stage causes the gate voltage to go below the threshold voltage, resulting in a higher dv/dt and a lower power loss. During the second stage, the gate current is reduced and the collector voltage rise causes the gate voltage to charge up because of the displacement current through the gate/collector capacitor. The gate voltage goes above the threshold voltage, resulting in excess carriers being injected into the IGBT's drift region through the gate channel, resulting in a lower turn-off di/dt and a reduced over-voltage during turn-off. The gate is discharged relatively slowly during the second stage of the turn-off operation. This stage continues through the rising period of the collector voltage and the falling period of the collector current. The third turn-off stage is initiated at the end of the rapid falling of the collector current and makes the gate voltage rapidly attain its final negative value. The low gate resistance during this third stage and during the steady state of turn-off improves the noise immunity during the off state of the IGBT, as well as reducing the total switching time.

In an exemplary implementation of the invention, the means for providing low resistance rapid charging and rapid final charging may include a power MOSFET connected in series with a low resistance value gate turn-on resistor between the turn-on voltage supply line and the gate input line, and the means for providing controlled current charging may include a bipolar transistor connected between the turn-on voltage supply line and the gate input line. The turn-on MOSFET is turned on during the first and third stages while the bipolar transistor is turned on during the second stage to effectively provide charging current to the gate at a controlled selected level during the second stage. Similarly, the means for providing low resistance rapid discharging and rapid final discharging may include a power MOSFET and a series connected low resistance gate turn-off resistor connected between the turn-off voltage supply line and the gate input line, and the means for providing controlled current discharging may include a bipolar transistor connected between the turn-off voltage supply line and the gate input line. The turn-off MOSFET is turned on during the first and third stages to provide rapid discharging during these stages, while the bipolar transistor is turned on during the second stage to provide discharge current from the gate at a controlled selected current level. Both the gate turn-on resistor and the gate turn-off resistor preferably have relatively low resistance values, for example, 0.5 ohm and typically less than 1 ohm. Such resistance values for the gate resistors are much lower than that normally used for IGBT gate resistors and result in very rapid charging or discharging of the gate during the periods while the MOSFET switches are turned on. The use of such low resistance gate resistors is permitted in the present invention because charging or discharging through the resistors takes place only during a portion of the turn-on or turn-off cycle, and such periods are separated by the period of controlled current charging or discharging, thereby avoiding the serious problems that would be encountered if low resistance gate resistors were continuously used for charging or discharging the gate.

Further objects, features and advantages of the invention will be apparent from the following detailed description when taken in conjunction with the accompanying drawings.

DETAILED DESCRIPTION OF THE INVENTION

Figure 1:
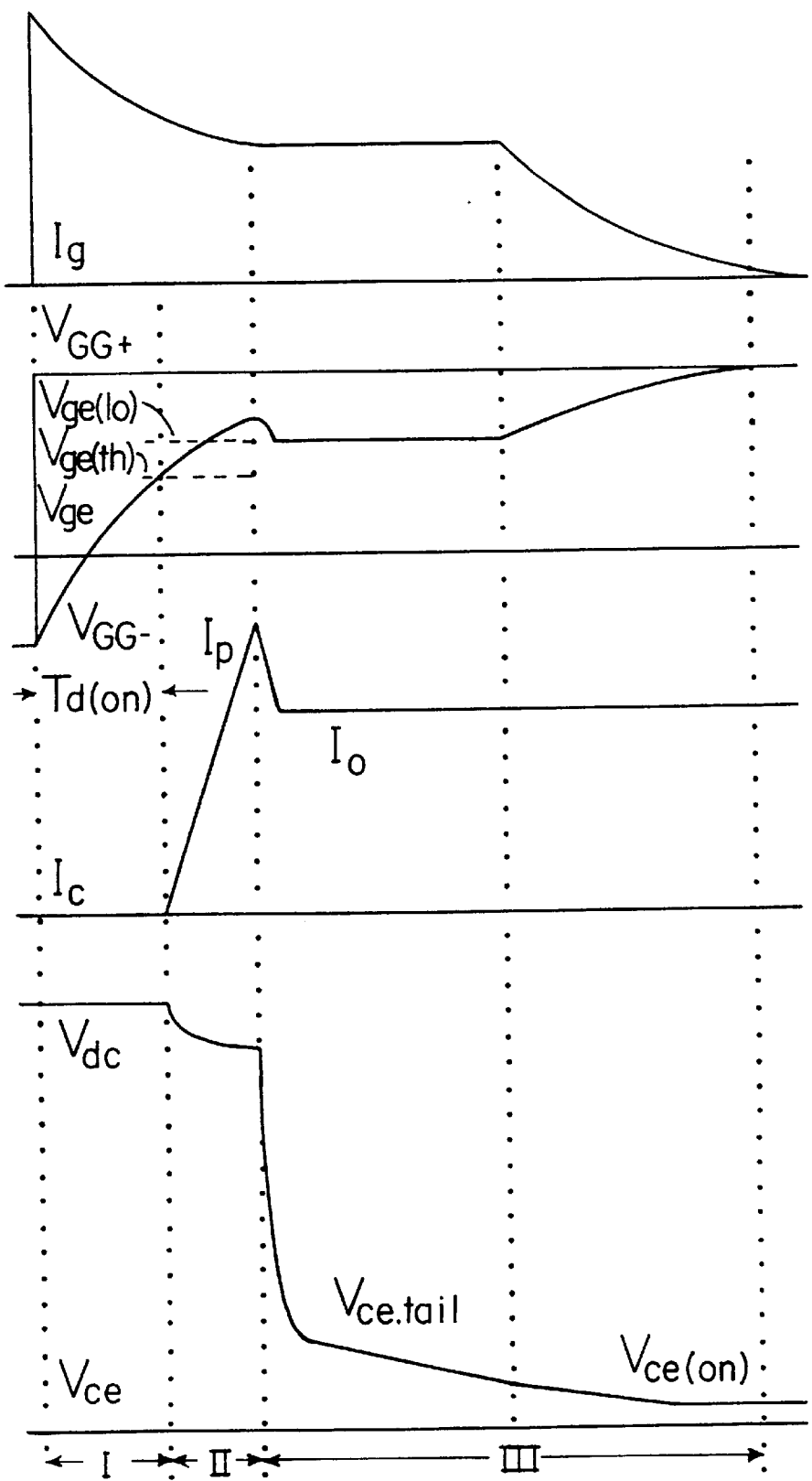
FIG. 1 are illustrative turn-on waveforms for an IGBT under inductive load switching utilizing a conventional gate drive circuit.
Figure 2:
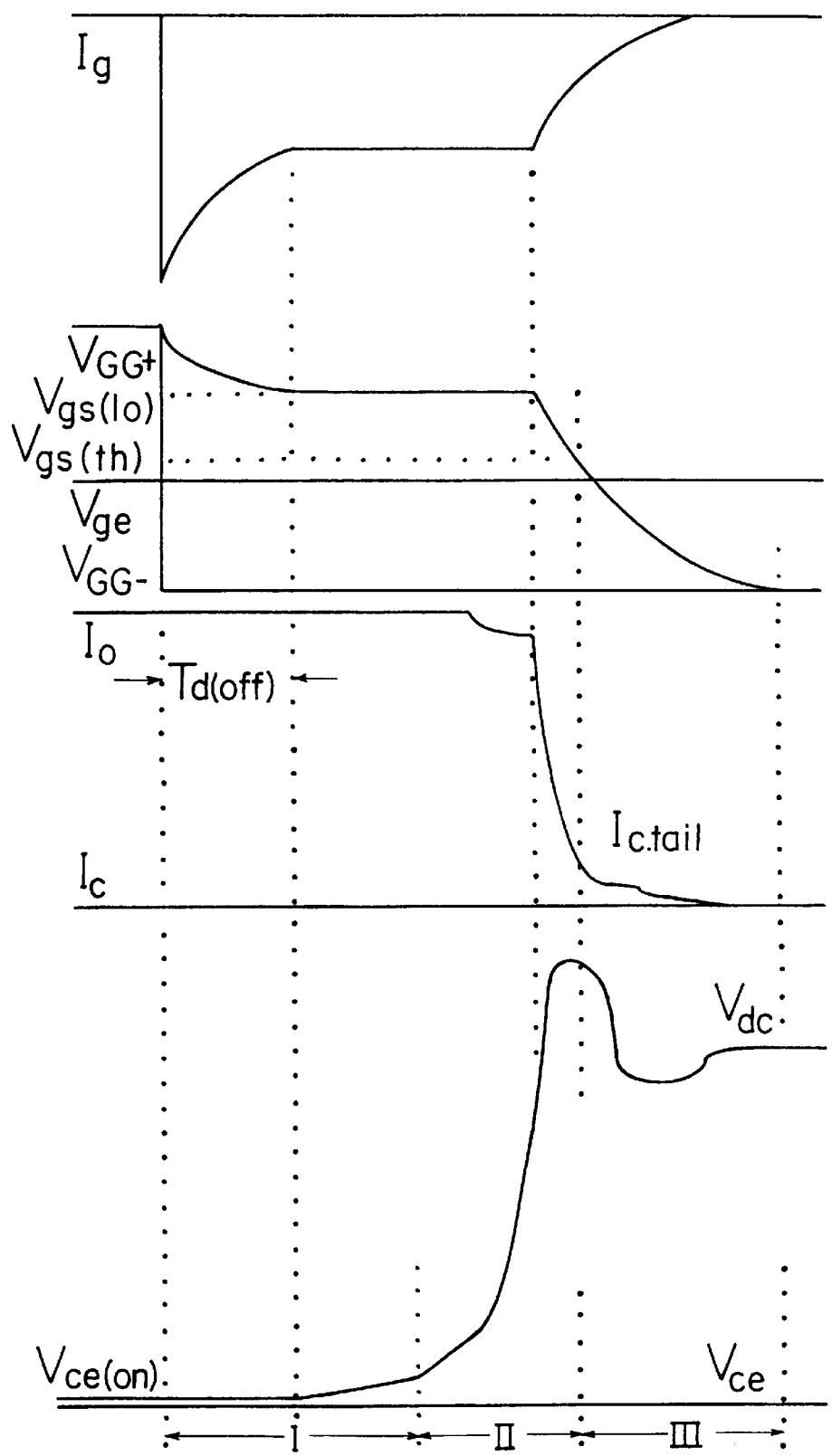
FIG. 2 are illustrative turn-off waveforms for an IGBT under inductive load switching utilizing a conventional gate drive circuit.

To illustrate the present invention, it is helpful to understand the characteristics of conventional gate drive circuits which are typically implemented with only passive components, i.e., resistors and capacitors. A typical conventional gate drive circuit includes a series connected transistor switch and a turn-on gate resistor connected between the gate and the positive turn-on gate supply voltage $V_{gg}+$, and a series connected transistor switch and a turn-off gate resistor connected between the gate and the negative turn-off gate supply voltage $V_{gg}-$. A simplified version utilizes the same resistor for both the positive and negative supply voltage. A capacitor may be connected between the gate and the emitter, and the values of the various resistors and capacitors are selected to provide a compromise for the various performance objectives. FIG. 1 illustrates typical turn-on waveforms for an IGBT under inductive load switching utilizing a conventional gate drive circuit, and FIG. 2 illustrates typical turn-off waveforms for the conventional circuit. The waveforms in FIGS. 1 and 2 illustrate waveforms for gate current ($I_g$), gate to emitter voltage ($V_{ge}$), collector current ($I_c$), and collector to emitter voltage ($V_{ce}$). The turn-on waveforms of FIG. 1 show the typical delay time before the rising of the collector current until the gate threshold voltage, $V_{ge}$(th), is reached, the reverse recovery transient at the end of the current rise, and the tail in the collector to emitter voltage at the end of the voltage fall. The waveforms of FIG. 2 illustrate the typical delay time before the collector voltage rise, the over-voltage during the collector current fall, and the tail phenomenon at the end of the collector current fall. Three distinct regions in the waveforms may be identified during both turn-on and turn-off, which are designated by the numerals I, II, and III in FIGS. 1 and 2. In the present invention, the effect of these regions is recognized, and the active gate drive circuit of the invention is designed to achieve improved performance during all three of the regions during turn-on and again during turn-off.

Figure 3:
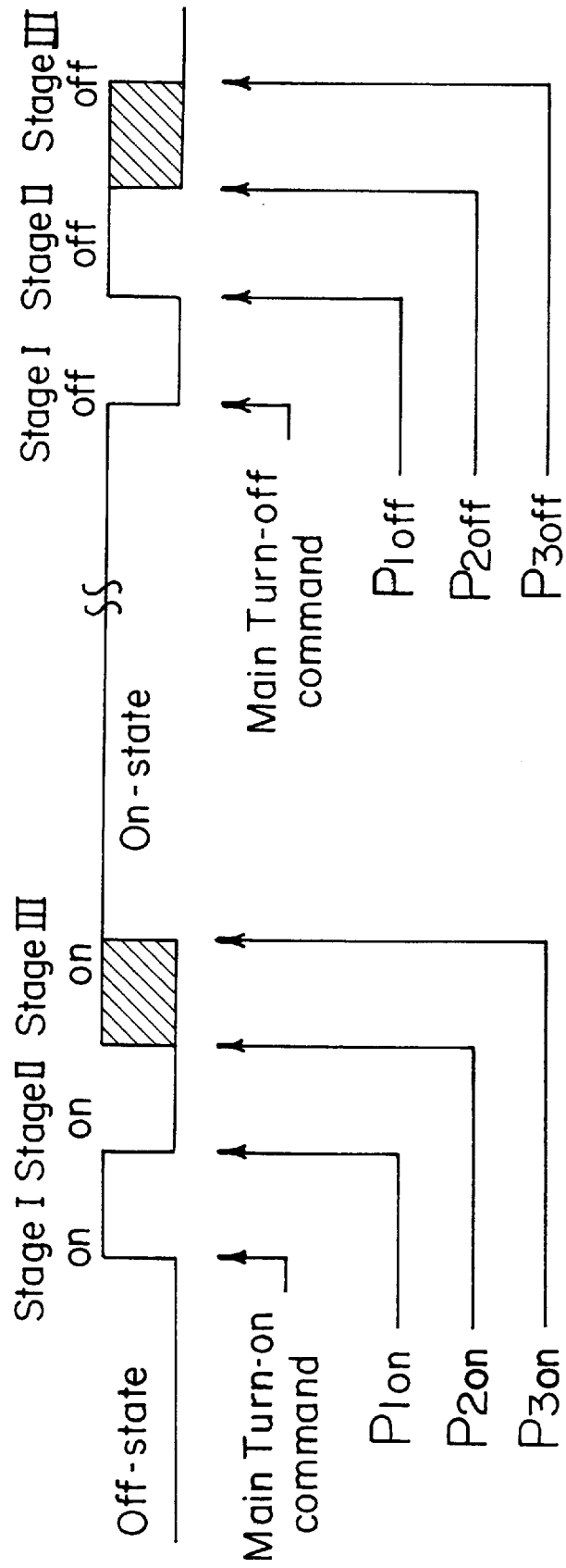
FIG. 3 is a simplified timing diagram in accordance with the present invention illustrating the three-stage active turn-on and turn-off switching of the invention.

FIG. 3 is a timing diagram illustrating the three-stage active turn-on and turn-off switching of the invention. This switching method is particularly directed to the type of power circuits represented by a hard-switched voltage source inverter leg. With reference to FIG. 3, the first turn-on stage (Stage I) immediately follows the main command turn-on signal at turn-on. This first stage is designed to minimize the delay time by rapidly charging the IGBT gate with a large gate current. Once the gate voltage has reached the threshold gate voltage level of the device, $V_{ge}$(th), the second turn-on stage (Stage II) is initiated. During this second stage, control of the turn-on di/dt is achieved by a reduced rate of charging of the IGBT gate, which can be achieved because the turn-on behavior of the IGBT is similar to that of a MOSFET, allowing the collector current to be controlled based on the gate voltage. Stage II continues until the collector current reaches the load current plus the peak reverse recovery current. The reverse recovery current can be effectively controlled due to the lower turn-on di/dt. The current injected into the gate during Stage II is reduced as compared to a conventional gate drive so as to minimize the effects of the reverse recovery current on the converter system. Such effects which are being reduced include the over-voltage across the complementary switch caused by the free-wheeling diode snap-off, and the EMI generated by the ringing during the reverse recovery transients. At this point, the circuit proceeds to the third turn-on stage (Stage III), and the gate is now rapidly charged to reduce the tail voltage, thus decreasing the power loss during turn-on. In addition, the Miller plateau duration and the total switching time are reduced during Stage III operation.

The primary objective of the active turn-off circuit in accordance with the invention is to control the over-voltage at turn-off with minimal switching delay and switching loss. The first turn-off stage (Stage I) of the three stages of the active turn-off control begins at the main turn-off command. Stage I consists of the rapid discharging of the gate-emitter capacitor until the rising instant of the collector voltage. Operation in this manner considerably reduces both the turn-off delay time and the power loss caused by the slow initial rise of the collector voltage. The large gate current during Stage I causes the gate voltage to go below the threshold voltage, resulting in a higher dv/dt and a lower power loss. At this point, the second turn-off stage (Stage II) is initiated and the gate current is reduced. The collector voltage rise during turn-off of the IGBT causes the gate voltage to charge up because of the displacement current through the gate-collector capacitor. The gate voltage goes above the threshold voltage, resulting in excess carriers being injected into the IGBT's buffer region through the gate channel. The result is a lower turn-off di/dt and a reduced over-voltage during turn-off. The gate is discharged slowly during Stage II of the turn-off operation. This stage continues through the rising period of the collector voltage and the falling period of the collector current. The third turn-off stage (Stage III) is initiated at the end of the rapid falling of the collector current and makes the gate voltage rapidly attain its final negative value. The low gate resistance during Stage III and turn-off steady state improves the noise immunity during the off-state of the IGBT. In addition, the total switching time is also reduced. Any re-turn-on of the IGBT is prevented by utilizing the three-stage turn-off method of the invention because the gate current remains negative in all three active turn-off stages, thus ensuring stable operation.

Figure 4:
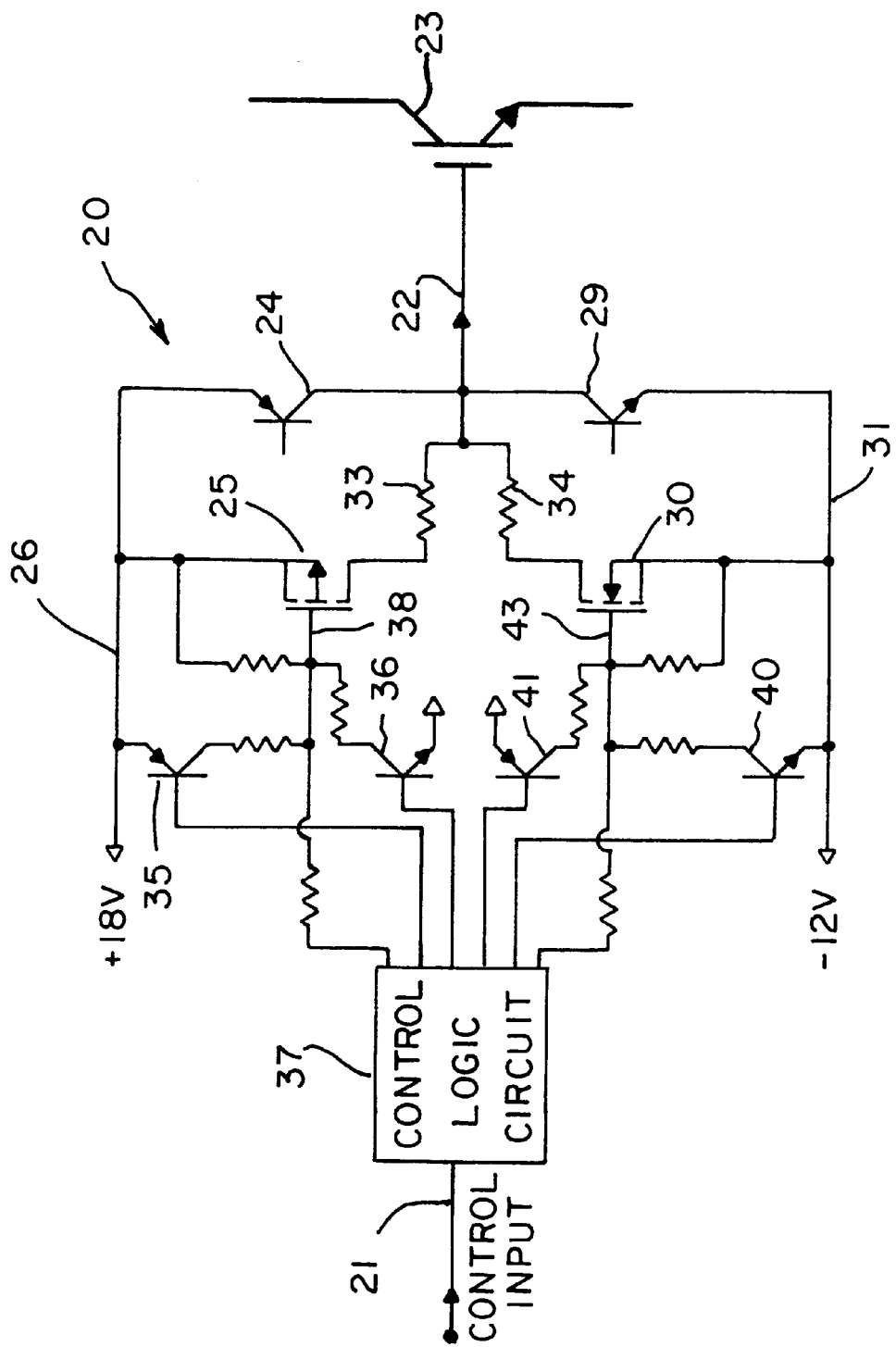
FIG. 4 is a simplified schematic diagram of the active gate drive circuit of the invention.

For purposes of explaining the invention, a simplified schematic circuit diagram of an active gate drive circuit in accordance with the invention is shown at 20 in FIG. 4. The active gate drive circuit 20 receives a control signal from the system controller or modulator (not shown) at a control input line 21 and provides the gate drive signal on an output line 22 that is connected to the gate of an IGBT 23. A bipolar junction transistor 24 and a MOSFET 25 are connected in parallel between the gate turn-on voltage supply line 26 and the gate line 22. Similarly, a bipolar junction transistor 29 and a MOSFET 30 are connected in parallel between the negative gate turn-off voltage supply line 31 and the gate line 22. A gate turn-on resistor 33 is connected between the MOSFET 25 and the gate line 22 and is preferably selected to have a relatively low resistance value (e.g., less than one ohm) to result in rapid charging of the IGBT gate. A gate turn-off resistor 34 is connected between the MOSFET 30 and the gate line 22, and also preferably has a relatively low resistance value (e.g., less than one ohm). Separate turn-on and turn-off resistors are preferred to limit short circuit current in case the switches 25 and 30 are on at the same time, but where the resistances of each will be the same, a single gate resistor may be used.

Stage I begins at receipt of the main turn-on command signal at the input 21, and at this point the MOSFET 30 is turned off and the MOSFET 25 is turned on. The use of a turn-on resistor 33 of very low resistance results in a rapid charging of the IGBT gate. The turn-off of the MOSFET 25 occurs at the end of Stage I at a time $P_{1on}$, as shown in FIG. 3, which corresponds to the rising instant of the collector current in the IGBT. However, due to the propagation time in the turn-off of the MOSFET 25, it is preferable to initiate the turn-off of the MOSFET switch 25 at a prior point in time. This point can be selected as a fixed period of time for an IGBT of a given rating. $P_{1on}$ can also be triggered using the measured gate voltage. At Stage II, the gate now charges at a controlled current level determined by the transistor 24, which is turned on and is used in the active region as a controlled current source during Stage II. The point $P_{2on}$ at the end of Stage II is preferably detected in the active gate drive of the invention by measurement of the voltage from the Kelvin emitter to the power emitter in the IGBT, which is related to collector current. This allows the gate of the IGBT to be controlled based on the instantaneous load current level. Once the collector current reaches the peak reverse recovery current, as determined, e.g., by measurement of the Kelvin emitter to power emitter voltage, Stage III is initiated by turning the MOSFET switch 25 on again. The point $P_{3on}$, marking the end of Stage III, is preferably a fixed period of time based on the ratings of the IGBT, and it can be considered the minimum on-time for the particular IGBT under consideration. At this point in time, the transistor 24 is off. The transistor 24 can, if desired, be turned on during Stage I before $P_{1on}$ and be turned off at or after $P_{2on}$ during Stage III.

The active gate drive circuit of the present invention also preferably implements a three-stage turn-off technique. At the main command received at the control input 21 to turn off the IGBT, the MOSFET switch 25 is turned off and the MOSFET switch 30 is turned on. The gate turn-off resistor 34 is selected to have a relatively low value (e.g., less than one ohm and typically about 0.5 ohm) in comparison with the recommended gate turn-off resistor value from the data sheets provided by the IGBT manufacturers. Stage I continues until the rising instant of the collector current. The point $P_{1off}$ at the end of Stage I may be detected using a collector voltage desaturation circuit. Stage II is initiated at this point in time by turning the MOSFET switch 30 off while the bipolar junction transistor 29 is turned on to drain current out of the gate at a controlled level during this stage. Stage II ends and Stage III is initiated at the point in time $P_{2off}$ which corresponds to the falling edge of the collector current. The gate voltage reaches its final negative value by $P_{3off}$, which can be considered to be the total turn-off time for the given IGBT. At this time, the transistor 29 is off. The transistor 29 can, if desired, be turned on during Stage I before $P_{1off}$ and be turned off at or after $P_{2off}$ during Stage III.

Bipolar transistors 35 and 36 are connected to receive input signals from a control logic circuit 37, which receives the control input on the line 21, and are connected to a line 38 leading to the gate of the MOSFET switch 25. Similar transistors 40 and 41 are connected to the control logic circuit 37 and are connected at their output to a line 43 leading to the gate of the MOSFET switch 30. The transistors 35 and 36 are used in timing the application of the gate voltage to the MOSFET switch 25 based on commands from the logic circuit 37, while the transistors 40 and 41 are used to control the gate voltage to the MOSFET switch 30 based on commands from the logic circuit 37.

It is understood that the MOSFETs 25 and 30 are illustrative of switches, and any suitable fast switch may equivalently be used. Similarly, the transistors 24 and 29 are illustrative of current control devices, and the functions of the MOSFETs and paralleled bipolar transistors may be combined where suitable devices are available to carry out the functions of each.

Figure 5:
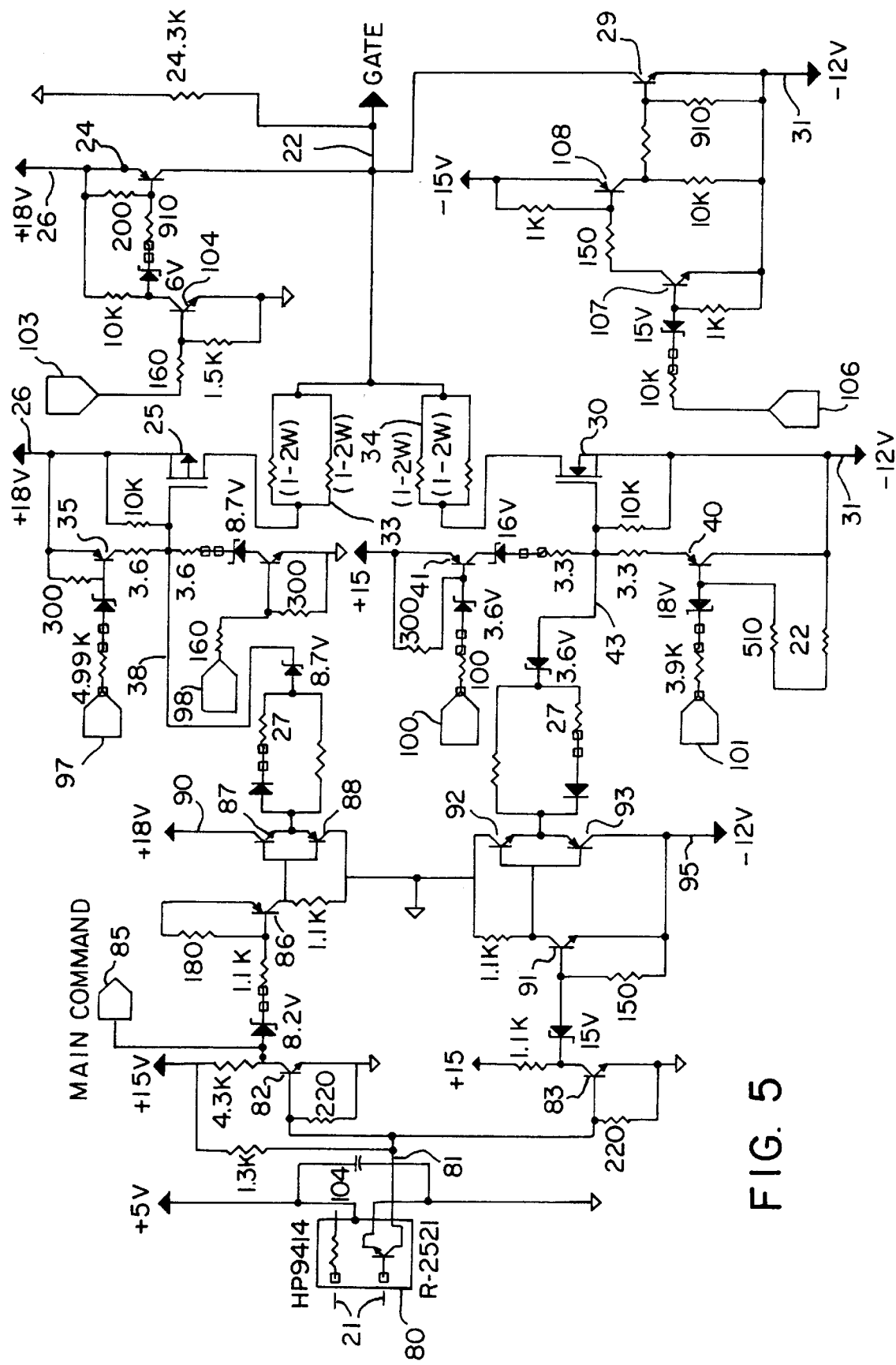
FIG. 5 is a detailed schematic diagram of an exemplary active gate drive circuit in accordance with the invention.
Figure 6:
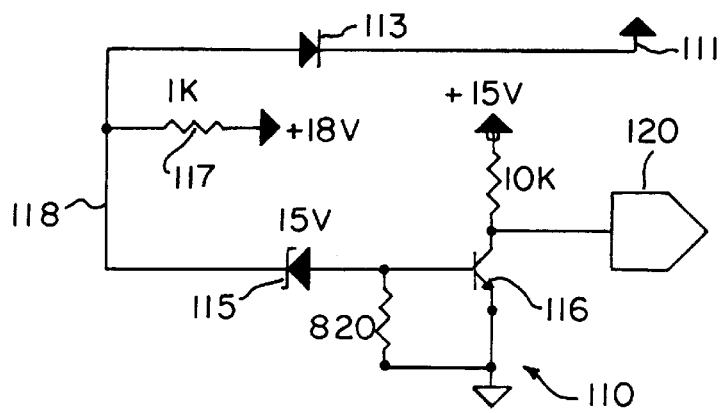
FIG. 6 is a schematic circuit diagram of a collector voltage detection circuit, a delay circuit for active turn-off, and a collector current detection circuit that may be utilized with the active gate drive circuit of the invention.
Figure 6:
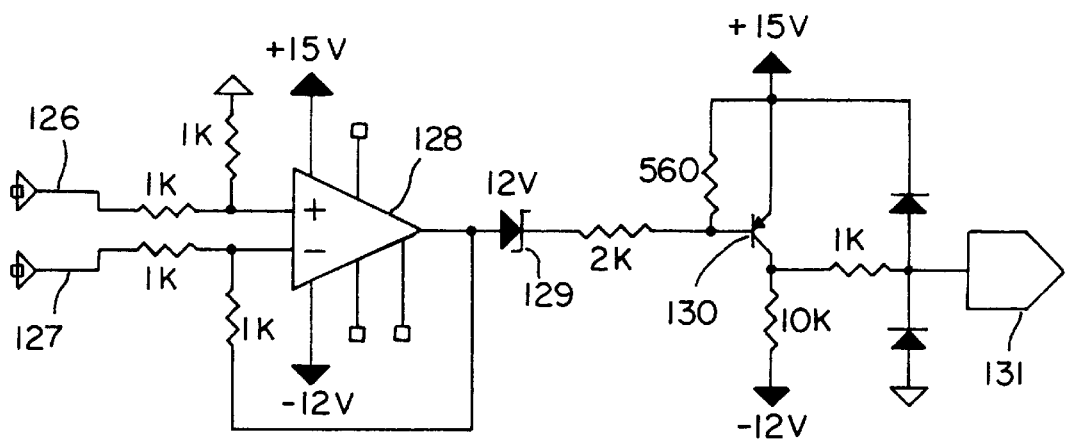
Figure 6:
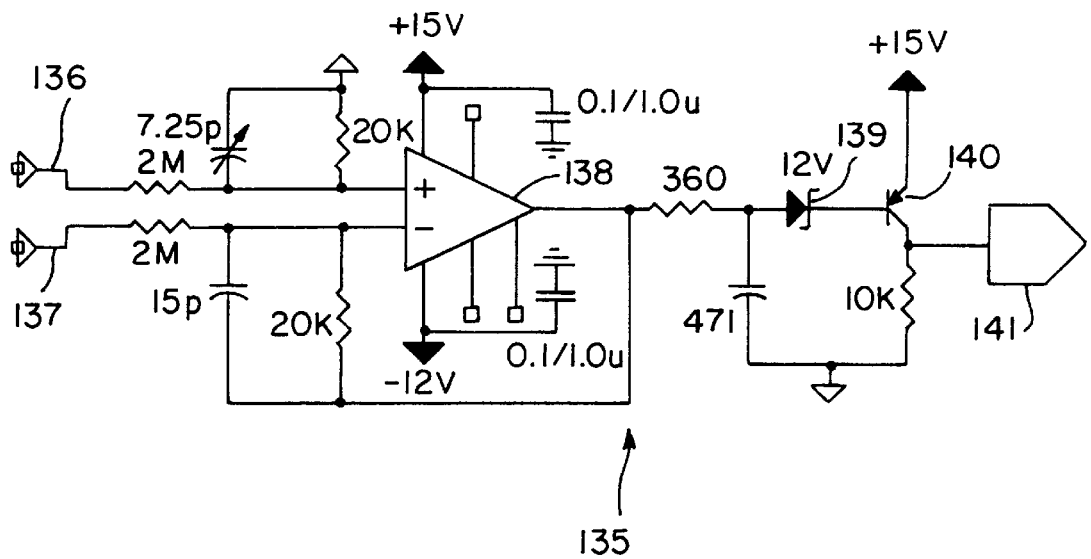
Figure 7A:
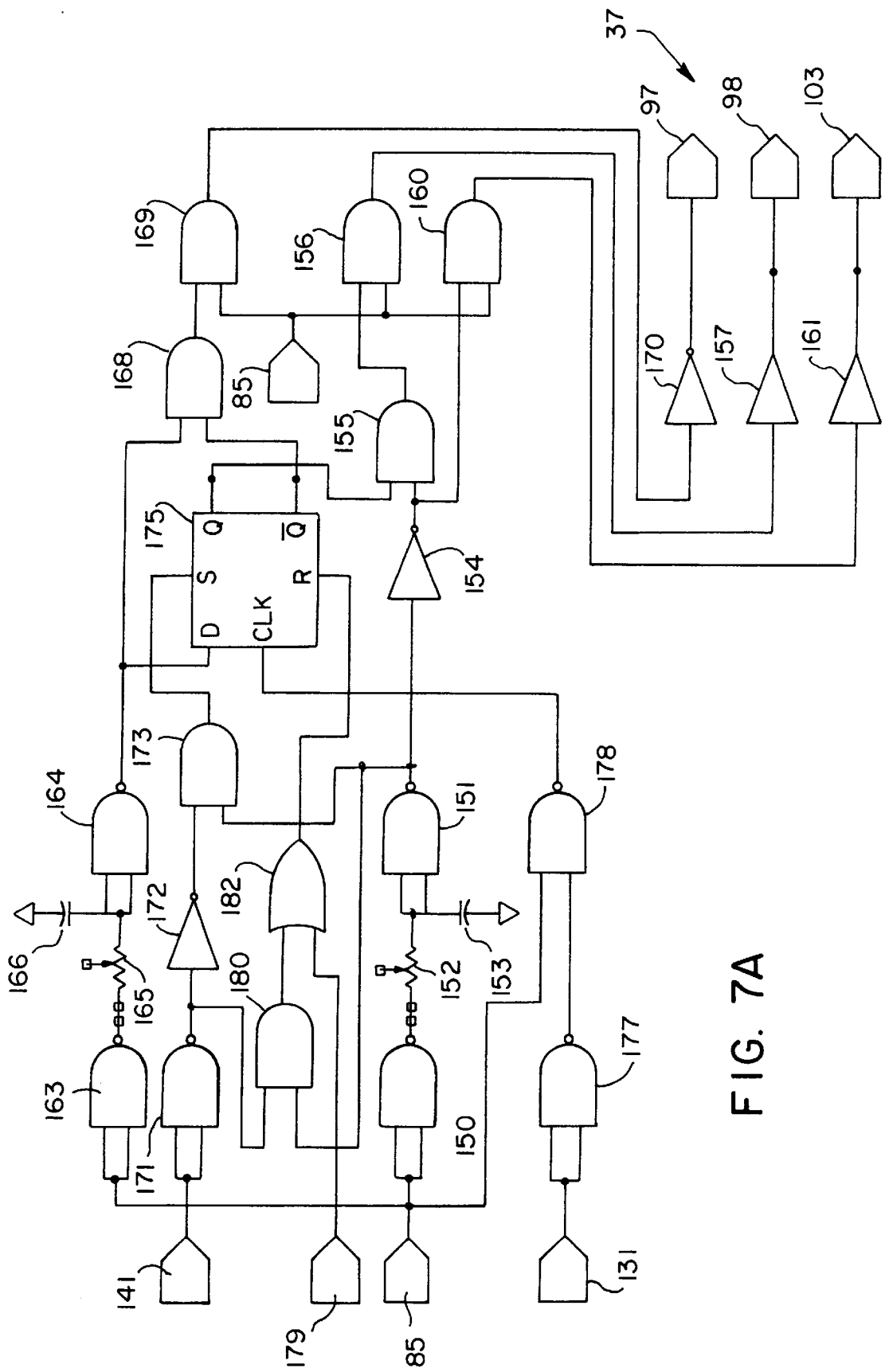
FIG. 7 is a schematic logic diagram for an exemplary control logic circuit for the active gate drive circuit of the invention.
Figure 7B:
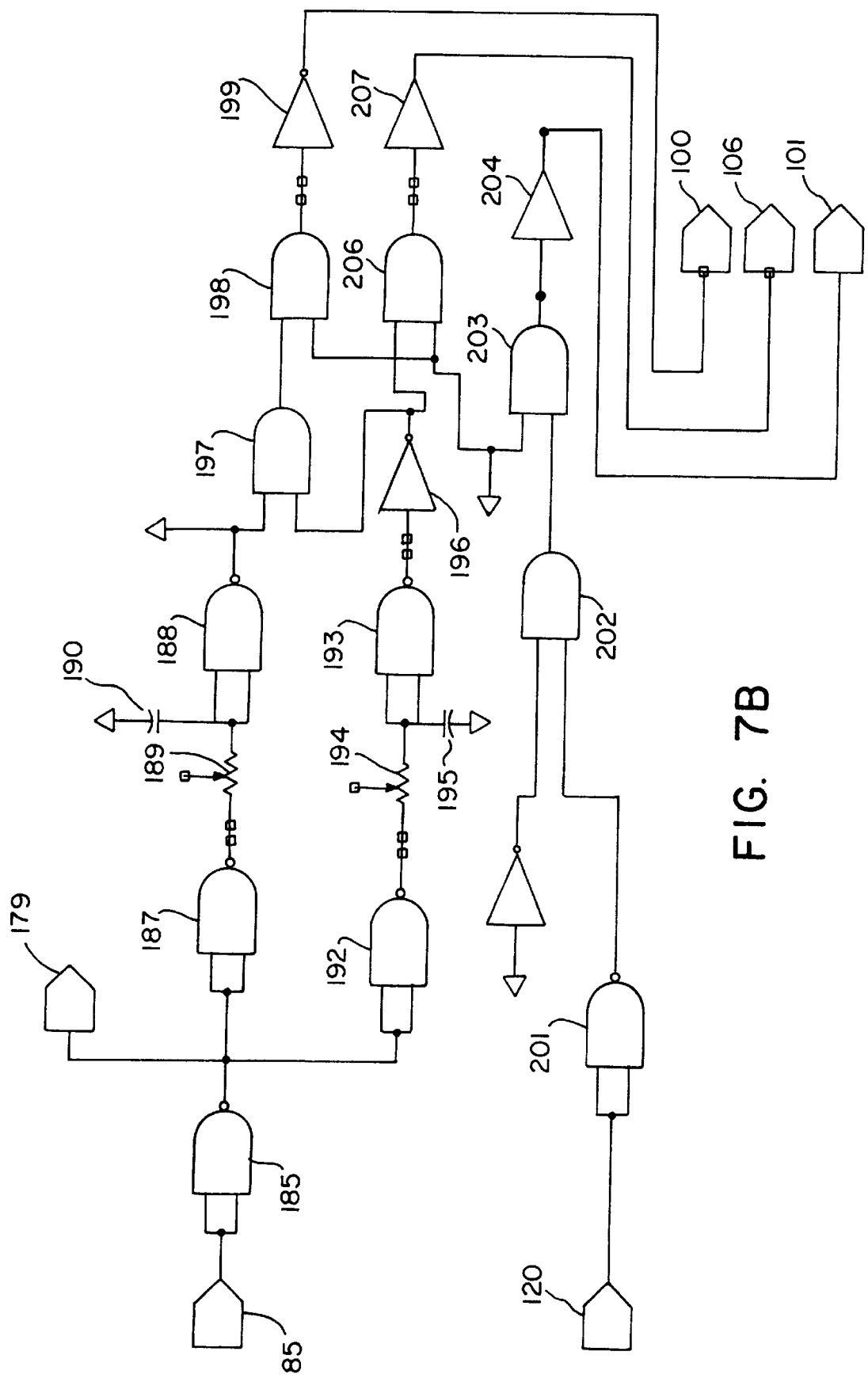

An example of an active gate drive is shown in more detailed circuit schematic diagrams in FIGS. 5 and 6 and in the logic diagram of FIG. 7. With reference to FIG. 5, the logic level command signal from a modulator (e.g., a microprocessor based controller, which is not part of the invention) at the input lines 21 is received by a coupler 80 which provides the command signal on a line 81 to the bases of buffer transistors 82 and 83. The output of the transistor 82 constitutes the main command signal and is provided at a connector 85 to the control logic circuit 37 shown in FIG. 7. The output from the transistor 82 is provided through additional drive transistors 86 and a transistor pair 87 and 88, which are connected to the positive gate drive voltage 90, to supply the main gating signal on the line 38 to the MOSFET switch 25. Similarly, the output of the transistor 83 is provided to a transistor 91 and a transistor pair 92 and 93 which are connected to the negative gate voltage 95. The output of the transistors 92 and 93 is provided as the main gating signal on the line 43 to the gate of the MOSFET switch 30. The additional gate control transistors 35 and 36, for the MOSFET 25, receive their control input signals at connectors 97 and 98, respectively, and the transistors 40 and 41, providing the additional gate control signals for the MOSFET 30, receive control input signals from connectors 100 and 101. The signals on the connectors 97, 98, 100 and 101 are provided by the control logic circuit 37 as described further below. The control logic circuit 37 also provides input signals on a connector 103 to a transistor 104 which supplies the base control signal to the transistor 24, and the control logic circuit provides a control signal via a connector 106 to a transistor 107 and thence to a transistor 108 which provides the base control signal to the transistor 29.

Schematic diagrams of ancillary circuits are shown in FIG. 6, including a desaturation detection circuit 110 which is connected to the collector terminal of the IGBT 23 by a line 111. The collector terminal voltage is provided through a diode 113 on a line 114 through a zener diode 115 to the base of a transistor 116. A resistor 117 is connected between a positive supply voltage (e.g., +18V) and the line 114 to normally bias the zener diode 115 above its break-over voltage and maintain the transistor 116 on. As the collector desaturation voltage is reached, the transistor 116 is turned off, raising the voltage at its collector which is provided as an output signal on a connector 120 to the control logic circuit 37. A collector current detection circuit 125 is connected by a line 126 to the Kelvin emitter and by a line 127 to the power emitter of the IGBT 23. The voltages on the lines 126 and 127 are provided to a differential operational amplifier 128, the output of which is provided through a zener diode 129 to the base of a transistor 130. The output of the transistor 130 is provided to a connector 131 leading to the logic circuit 37. Commercially available power IGBTs typically have external terminals that allow connection to the Kelvin emitter and the power emitter of the device, and the impedance between these terminals provides a convenient way of measuring collector current. However, other techniques and circuits for measuring collector current (e.g., commercial current sensors) may also be utilized. A collector voltage detection circuit 135 receives the voltage at the power collector of the IGBT 23 on a line 136 and the voltage at the Kelvin emitter on a line 137. These voltages are provided to a differential operational amplifier 138, the output of which is provided through a zener diode 139 to a transistor 140. The output of the transistor 140 is provided to a connector 141 leading to the control logic circuit 37.

As shown in FIG. 7, the main command signal is provided at the connector 85 to logic in the circuit 37 that provides the control signals to the connectors 97 and 98 for the MOSFET 25 and to the connector 103 that provides the control signal for the transistor 24. The main command signal at the connector 85 is also provided to logic in the circuit 37 that provides the control signals at the connectors 100 and 101 for the MOSFET 30 and at the connector 106 for the transistor 29. For the control of the MOSFET 25 and the transistor 24, the main command signal at the connector 85 is provided to NAND gates 150 and 151 connected by a resistor 152 and capacitor 153 to provide a time delay. The time delayed output of the gate 151 is provided through an inverter 154 to an AND gate 155 and thence through an AND gate 156 and a buffer 157 to the output connector 98 leading to the transistor 36. The output of the inverter 154 is also provided to an AND gate 160 and through a buffer 161 to the connector 103 which controls the transistor 24. The signal on the line 85 is also provide through NAND gates 163 and 164 connected together by a resistor 165 and a capacitor 166 to provide a time delay function. The time delayed signal from the NAND gate 164 is provided to an AND gate 168 and then to an AND gate 169 and through an inverter 170 to the output connector 97 which controls the transistor 35. The signal from the connector 141 is provided to a NAND gate inverter 171, thence through another inverter 172 to an AND gate 173, the output of which is provided to the set input of a flip flop 175. The AND gate 173 also receives the output from the NAND gate 151. The collector current detection circuit signal from the connector 131 is provided to a NAND gate 177 configured as an inverter and thence to another NAND gate 178 which receives the main command signal from the connector 85, the output of which is provided to the flip flop 175 as the clock input. The output of the NAND gate 171 is provided to an AND gate 180, which receives at the other input the output of the NAND gate 151, and the gate 180 provides its output to an OR gate 182 which also receives the command input 21, and the output of the OR gate 182 is provided as the reset input to the flip flop 175. The flip flop 175 also receives the output of the NAND gate 164 at the D input. The non-inverted output of the flip flop 175 is provided to the AND gate 155, and the inverted output is provided to the AND gate 168.

The delay function provided by the gates 163 and 164 provides a delayed main command signal (delayed to the point in time $P_{1on}$). The inverted output $\overline{Q}$ of the flip-flop 175 goes low at $P_{2on}$, and hence the output of the gate 168 is a short positive pulse between the times $P_{1on}$ and $P_{1on}$. The gate 169 "ands" this pulse with the main command signal from the connector 85 to ensure that the pulse is applied only when the main command is high. The inverter 170 thus provides an output at the connector 97 that is a negative pulse between the times $P_{1on}$ and $P_{2on}$. The flip-flop 175 is clocked by the signal on the connector 131 from the collector current detection circuit, which is based on the sensed current rise in the IGBT. The gate 178 ensures that this clock signal is passed to the flip-flop 175 only when the main command signal is high. The clock latches the signal from the gate 164 to the output Q of the flip-flop 175, thereby ensuring that $P_{2on}$ can occur only after $P_{1on}$. The flip-flop 175 is reset by the signal on the connector 141, so that the $P_{2on}$ transition is reset if the collector voltage in the IGBT is too high (which can occur during faults). The flip-flop 175 is set by the output of the gate 151 (delayed from the main commercial signal to the time $P_{3on}$) if the signal from the connector 141 is OK (in a high state), implemented by the AND gate 173, thus ensuring that $P_{2on}$ is forced to occur before $P_{3on}$ if everything is OK (no faults). The output of the gate 155 is a high signal between $P_{2on}$ and $P_{3on}$. The gate 156 ensures that this signal is passed along only when the main command signal is high. This positive going pulse is buffered by the buffer 157 and provided as the output signal on the connector 98. The output of the gate 160 is a pulse that is high from the main turn-on command to the time $P_{3on}$. This pulse is buffered at 161 and put out on the connector 103.

Similarly, for the control of the MOSFET 30 and the transistor 29, the main command signal on a line 85 is provided to a NAND gate inverter 185, the output of which is provided through the connector 179. The output of the NAND gate 185 is also provided to NAND gates 187 and 188 connected by a resistor 189 and capacitor 190 to provide a time delay function, and to NAND gates 192 and 193 connected by a resistor 194 and a capacitor 195 to provide a time delay function, the output of which is provided through an inverter 196. The outputs of the NAND gate 188 and the inverter 196 are provided to an AND gate 197, and thence to an AND gate 198 and inverter 199 to provide the output signal at the connector 100 which controls the transistor 41. The signal from the desaturation circuit 110 on a connector 120 is provided to an inverting NAND gate 201 and thence to an AND gate 202, the output of which is provided to an AND gate 203 connected to a buffer 204 and thence to the output connector 101 which provides the signal to control the transistor 40. The output of the inverter 196 is also provided to an AND gate 206 and thence to a buffer 207 to provide the output signal on the connector 106 that controls the transistor 29.

The input signal at the connector 120 is the collector voltage sense signal. The output of the gate 201 goes high when the collector voltage rises (at $P_{1off}$). The output of the gate 202 is a positive pulse between the times $P_{1off}$ and $P_{2off}$. The AND gate 203 ensures that this pulse is passed only when the main bar (inverse of main command) is high. The signal at the connector 101 is a buffered positive pulse between the times $P_{1off}$ and $P_{2off}$. The delay function from the gates 187 and 188 provides the $P_{2off}$ edge at a fixed delay. The gate 197 is used to provide a positive pulse between $P_{2off}$ and $P_{3off}$. The gate 198 ensures that this pulse is passed along only when the main bar is high. The output signal at the connector 100 is an inverted version of this pulse. The output at the connector 106 is a positive pulse between the turn-off command and $P_{3off}$.

Figure 8:
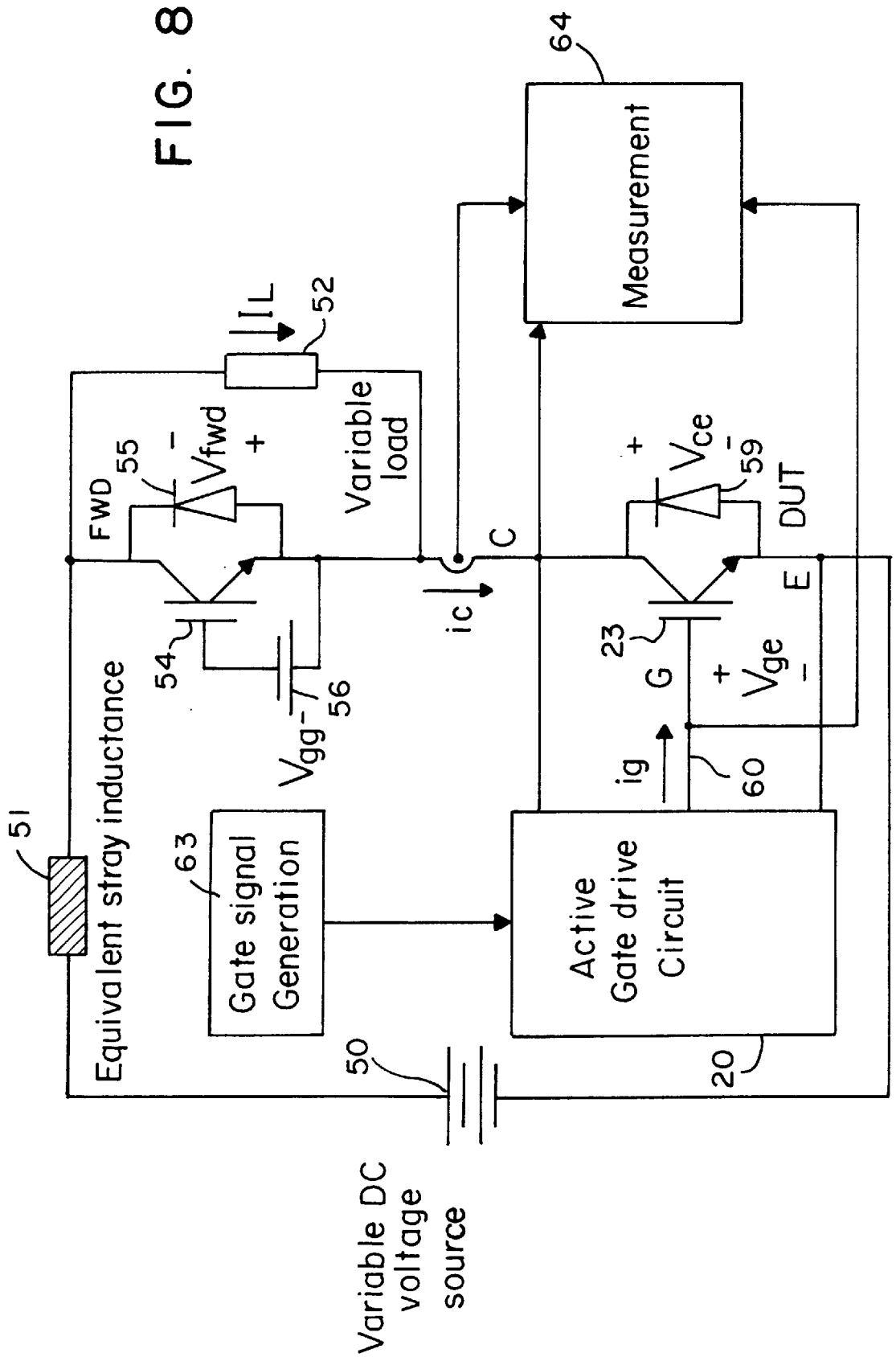
FIG. 8 is a simplified schematic diagram of a test circuit for testing the characteristics of the active gate drive circuit.

FIG. 8 illustrates a test circuit for determining the characteristics of an IGBT 23 under the control of an active gate drive circuit 20 in accordance with the invention. A variable DC voltage source 50 is connected through an equivalent stray inductance 51 to a variable simulated load circuit comprised of an inductor 52 in parallel with an IGBT 54 and parallel diode 55, with the gate of the IGBT 54 supplied with a negative gate voltage from a source 56. The IGBT 23 that is under test has a parallel connected free wheeling diode 59 and is connected by a line 60 to receive the drive voltage from the active gate drive circuit 20. A gate signal generation circuit 63 provides the logic level command signals to the drive circuit 20. A measurement circuit 64 measures the collector current through the IGBT 58 as well as the gate to emitter and collector to emitter voltages across the IGBT.

Figure 9:
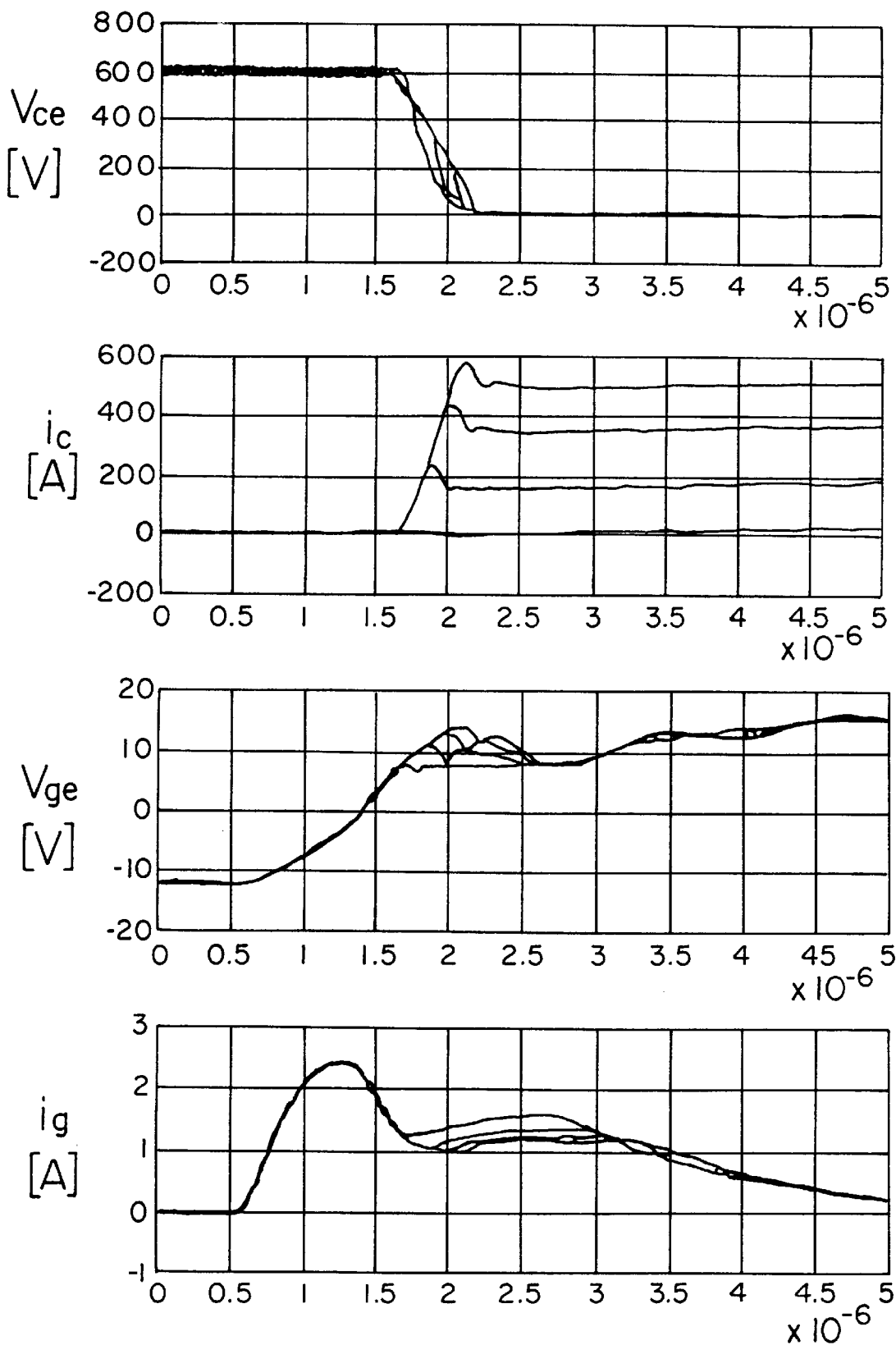
FIG. 9 are measured turn-on switching waveforms for an IGBT driven by a conventional gate drive circuit at various current levels.
Figure 10:
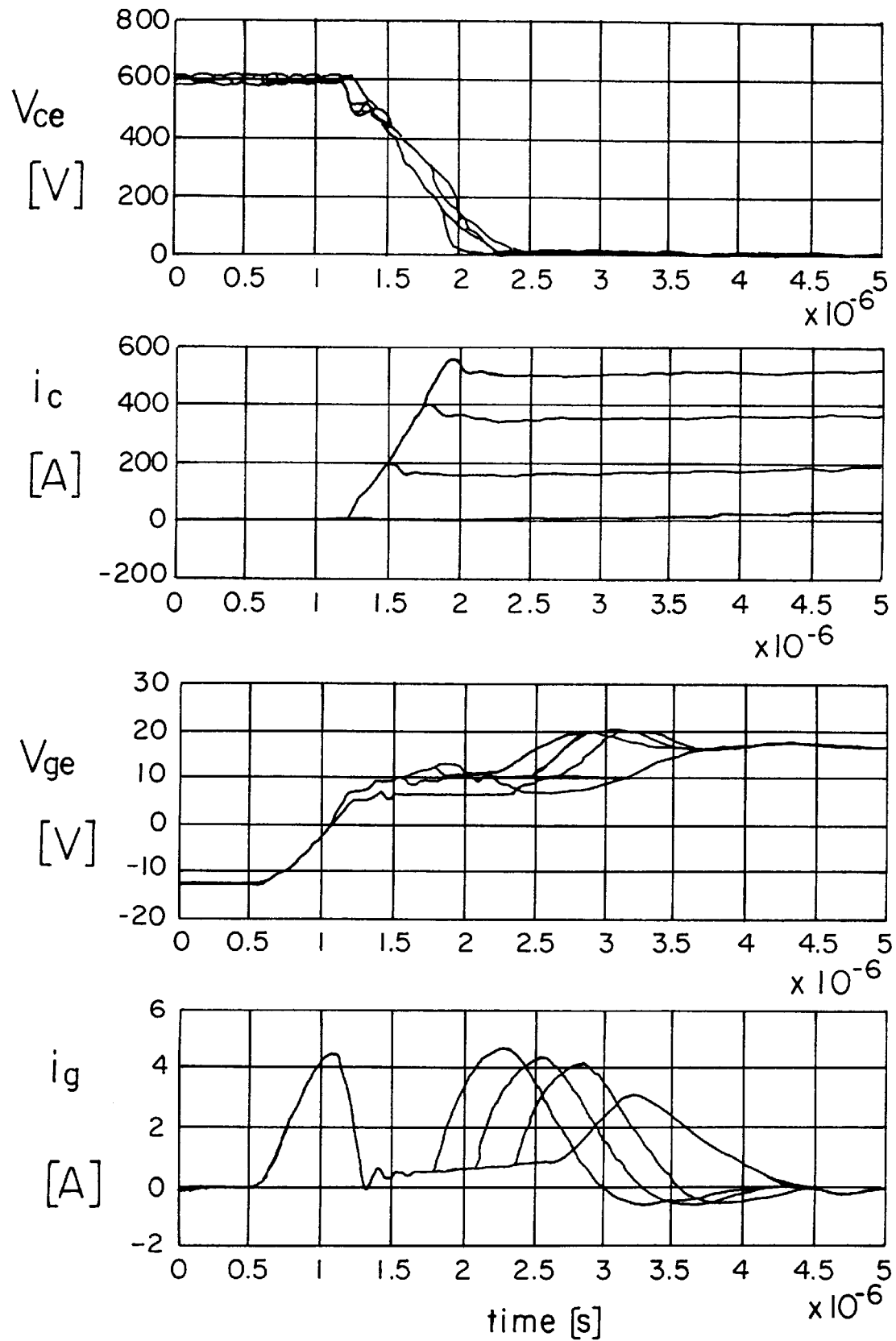
FIG. 10 are measured turn-on switching waveforms of an IGBT driven by an active gate drive circuit in accordance with the invention at various current levels.

The test circuit of FIG. 8 was utilized to investigate the operational performance of the three-stage active gate drive circuit 20. The IGBT device used for the experimental test is a 1200V, 600 A Powerex IGBT (CM600HA-24H). Switching waveforms for the conventional gate drive were acquired using a gate resistance of 5.6 $\Omega$, which is a typical value for obtaining acceptable low noise switching for this particular commercial IGBT. The values of the resistors 33 and 34 in the turn-on and turn-off circuit 20, as shown in FIG. 4, were both chosen to be 0.5 $\Omega$, much lower than is normally acceptable. The trigger point for all measurements is the main command at the input 21 to the gate drive, which corresponds to zero in the time axis in FIGS. 9–12. FIGS. 9 and 10 show measured turn-on switching waveforms with a conventional gate drive and with the gate drive of the invention, respectively, at current levels of 0, 150, 350, and 500 A. Other conditions are $V_{dc}$=600V, $V_{gg+}$=18V, $V_{gg-}$=−12V. The waveforms plotted are the collector voltage, $V_{ce}$, the collector current, $i_c$, the gate voltage, $V_{ge}$, and the gate current, $i_g$. It can be seen that the drive circuit of the invention reduces the turn-on delay time as well as the total switching time, while limiting the reverse recovery current below that obtained using the conventional gate drive. The di/dt in the active gate drive circuit is controlled during Stage II to a lower value than for the conventional drive, and the collector voltage is held higher for a longer duration during the rising time of the collector current. The time required for the gate voltage to reach the given positive bias voltage, +18V, is reduced using the active gate drive. Therefore, the turn-on switching energy due to the tail voltage can be considerably reduced. The effect of variation of collector current level on the active gate drive can be seen from the gate current waveforms, which show the adaptation of the duration of Stage II based on the instantaneous load current level.

If a small fixed gate resistor (e.g., 0.5 Ω) were used in the conventional gate drive circuit, the peak reverse recovery current and the peak voltage across the free-wheeling diode would be large. In particular, there would be large oscillations at low current turn-on. This effect occurs because the rapid turn-on of the IGBT device can set up highly underdamped oscillations between the parasitic capacitance of the device and the inductance of the bus structure and interconnects. The snap-off process during the reverse recovery excites the oscillation. The reduction in oscillation at higher current levels is caused by the conductivity modulation lag effect during the turn-on transient. This effect increases the effective resistance in the circuit at turn-on, and dampens out the turn-on oscillations. The active gate drive 20 extends the duration of Stage II turn-on operation and damps out oscillations at low current turn-on, as shown in FIG. 10. Increase in the turn-on power loss due to a longer Stage II does not occur due to the very low load current level.

Control of the turn-on di/dt in the conventional gate drive can be achieved by selection of the value of the gate resistor. The whole gate current waveform is lowered when the gate resistor value is increased, which leads to a longer turn-on delay and a larger collector voltage tail. In contrast, the turn-on di/dt in the active gate drive 20 is effectively controlled by the variation of gate current during Stage II without affecting the delay time.

Figure 11:
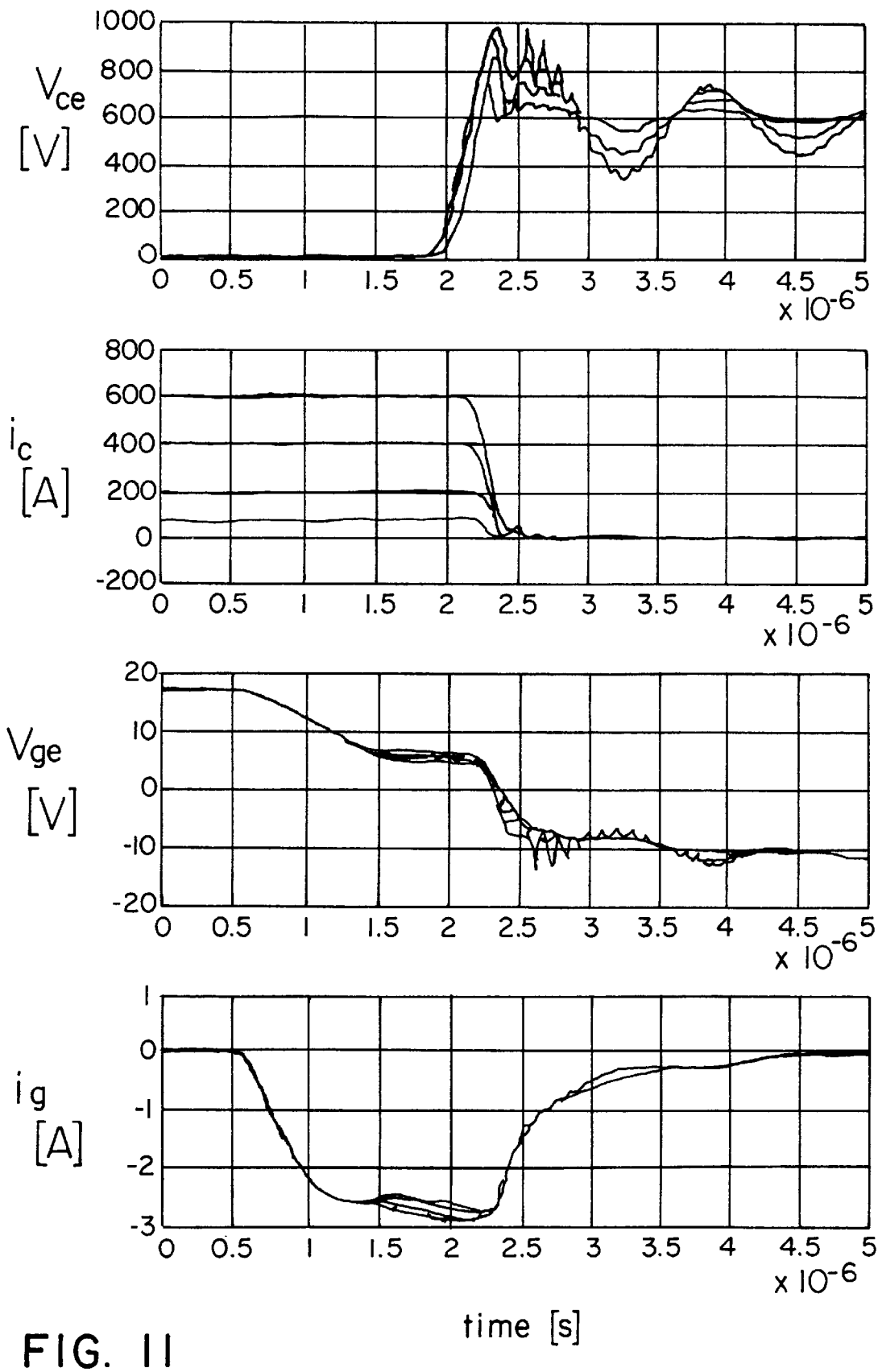
FIG. 11 are measured turn-off switching waveforms for an IGBT driven by a conventional gate drive circuit at various current levels.
Figure 12:
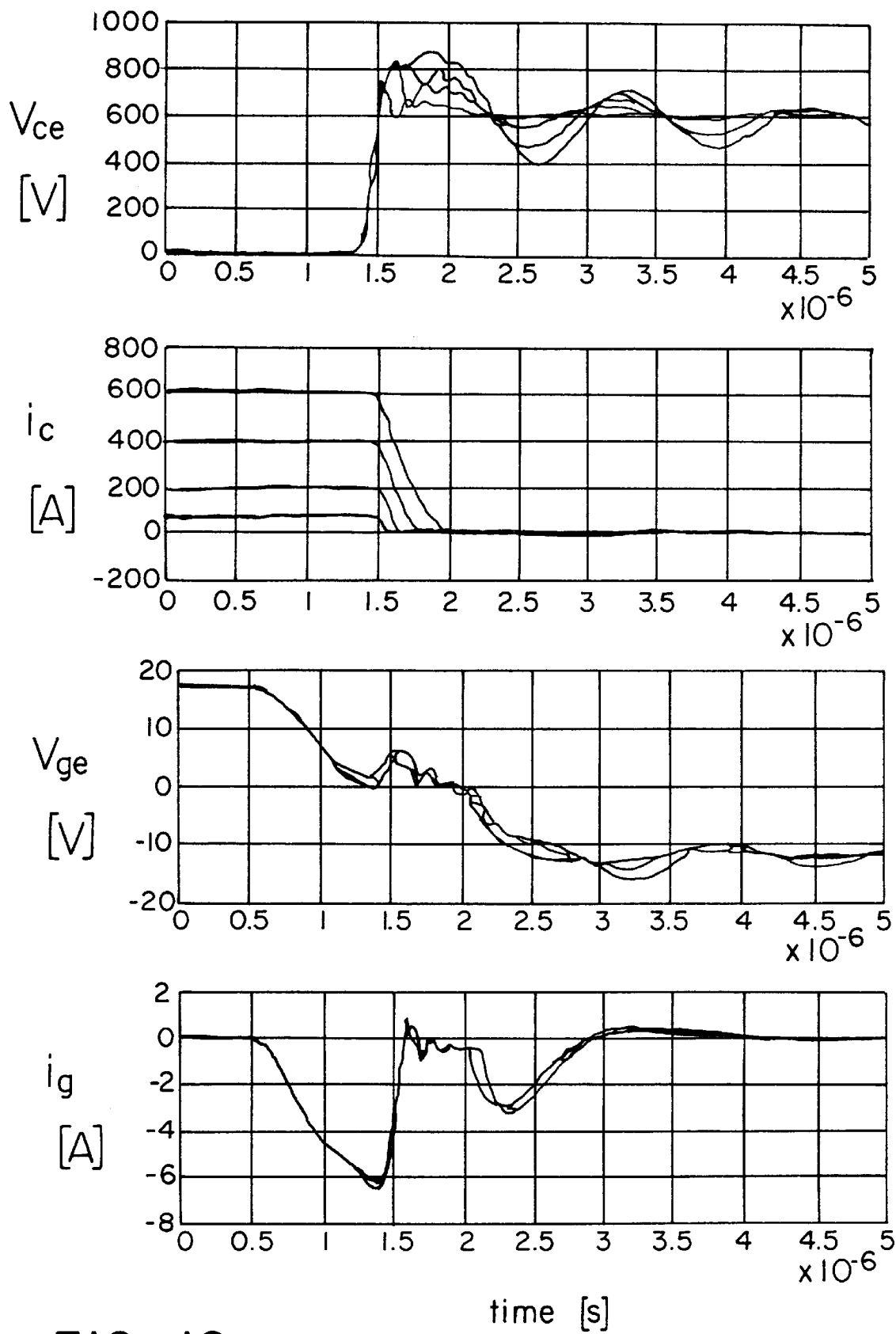
FIG. 12 are measured turn-off switching waveforms for an IGBT driven by the active gate drive circuit of the invention at various current levels.

FIGS. 11 and 12 show measured turn-off switching waveforms ($v_{ce}$, $i_c$, $V_{ge}$, $i_g$) for a conventional gate drive and for the active gate drive, respectively, at current levels of 80, 205, 405, 620 A. The turn-off gate resistor used in the conventional gate drive is 5.6 Ω. Other conditions are $V_{dc}$=600V, $V_{gg}$+=18V, and $V_{gg}$-=-12V. The values of the turn-on and turn-off resistors 33 and 34 was 0.5 Ω. It is seen from these figures that the turn-off dv/dt is higher in the active gate drive while the di/dt is lower. The active gate drive has a lower over-shoot and ringing in the collector voltage waveform, which can result in lower EMI generated during the turn-off transient. The peak over-shoot in the collector voltage is limited to a lower level for a wide range of collector currents in the active gate drive. As turn-off delay time is varied with load current, the transition from Stage I to Stage II is adapted by the active gate drive to further reduce the turn-off di/dt at higher current levels. The active turn-off reduces the switching losses by reducing the slow initial rising duration of the collector voltage, while at the same time achieving better control of the over-voltage as compared to the results obtained utilizing a large gate resistor in the conventional gate drive circuit.

The control of the turn-off di/dt during the turn-off switching transient is achieved in the conventional gate drive by controlling the gate resistor value. Increasing the gate resistor value results in increased switching delay and a softer switching transient. The lower dv/dt that occurs with larger gate resistors increases the turn-off energy. The di/dt control in the active gate drive is achieved by advancing or delaying the $P_{1off}$ control point. This determines the gate voltage level during Stage II of active turn-off. The switching delay time and the di/dt variation are de-coupled. The higher turn-off di/dt results in higher collector over-voltage, but reduces the energy loss.

It is understood that the invention is not confined to the embodiments set forth herein as illustrative, but embraces all forms thereof as come within the scope of the following claims.

What is claimed is:

1. A gate drive circuit for IGBTs comprising:
   (a) turn-on switch means for providing low resistance rapid charging of the gate of an IGBT;
   (b) turn-on controlled current means for providing controlled current charging of the gate of the IGBT; and
   (c) means for turning on the turn-on switch means to provide low resistance rapid charging of the gate of an IGBT during a first turn-on stage after receipt of a main command turn-on signal, means for turning on the turn-on controlled current means to provide controlled current charging of the gate of the IGBT during a second turn-on stage that follows the first turn-on stage, and means for turning on the turn-on switch means to provide rapid low resistance final charging of the gate of the IGBT to a turn-on voltage supply level during a third turn-on stage that follows the second turn-on stage and for maintaining the turn-on supply voltage level at the gate while the main turn-on signal is present.

2. The gate drive circuit of claim 1 wherein the first stage continues until the gate threshold voltage of the IGBT is reached whereupon the second stage is initiated by turning on the turn-on controlled current means.

3. The gate drive circuit of claim 2 wherein the second stage continues until the collector current of the IGBT reaches the load current plus the peak reverse recovery current whereupon the third stage is initiated by turning on the turn-on switch means.

4. The gate drive circuit of claim 1 wherein the turn-on switch means includes a MOSFET switch and a low resistance gate turn-on resistor connected in series between a turn-on gate supply voltage line and a gate input line connected to the gate of the IGBT.

5. The gate drive circuit of claim 4 wherein the gate turn-on resistor has a resistance of less than one ohm.

6. The gate drive circuit of claim 1 wherein the turn-on controlled current means includes a bipolar junction transistor connected between a turn-on gate supply voltage line and a gate input line connected to the gate of the IGBT.

7. The gate drive circuit of claim 1 wherein the first stage continues for a selected fixed period of time whereupon the second stage is initiated by turning on the turn-on controlled current means.

8. The gate drive circuit of claim 1 wherein the second stage continues until the voltage measured between the Kelvin emitter and the power emitter of the IGBT reaches a selected level.

9. A gate drive circuit for IGBTs comprising:
   (a) turn-off switch means for providing low resistance rapid discharging of the gate of an IGBT;
   (b) turn-off controlled current means for providing controlled current discharging of the gate of the IGBT; and
   (c) means for turning on the turn-off switch means to provide low resistance rapid discharging of the gate of the IGBT during a first turn-off stage after receipt of a main turn-off signal, means for turning on the turn-off controlled current means to provide controlled current discharging of the gate of the IGBT during a second turn-off stage that follows the first turn-off stage, and means for turning on the turn-off switch mean to provide rapid low resistance final discharging of the gate of the IGBT to a turn-off voltage supply level during a third turn-off stage that follows the second turn-off stage and for maintaining the turn-off voltage level at the gate while the main turn-off signal is present.

10. The gate drive circuit of claim 9 wherein the first stage continues until the collector voltage of the IGBT begins to rise whereupon the second stage is initiated by turning on the turn-off switch means.

11. The gate drive circuit of claim 9 wherein the second stage continues until the end of the rapid falling of the collector current of the IGBT whereupon the third stage is initiated by turning on the turn-off switch means.

12. The gate drive circuit of claim 9 wherein the turn-off switch means includes a MOSFET switch and a low resistance gate turn-off resistor connected in series between a turn-off gate supply voltage line and a gate input line connected to the gate of the IGBT.

13. The gate drive circuit of claim 12 wherein the gate turn-off resistor has a resistance of less than one ohm.

14. The gate drive circuit of claim 9 wherein the turn-off controlled current means includes a bipolar junction transistor connected between a turn-off supply voltage line and a gate input line connected to the gate of the IGBT.

15. The gate drive circuit of claim 9 wherein the first stage continues until the gate voltage of the IGBT goes below the threshold gate voltage of the IGBT whereupon the second stage is initiated by turning on the turn-off controlled current means.

16. A gate drive circuit for IGBTs comprising:
   (a) turn-on switch means for providing low resistance rapid charging of the gate of an IGBT;
   (b) turn-on controlled current means for providing controlled current charging of the gate of the IGBT;
   (c) turn-off switch means for providing low resistance rapid discharging of the gate of the IGBT;
   (d) turn-off controlled current means for providing controlled current discharging of the gate of the IGBT; and
   (e) means for turning on the turn-on switch means to provide low resistance rapid charging of the gate of an IGBT during a first turn-on stage after receipt of a main turn-on signal; means for turning on the turn-on controlled current means to provide controlled current charging of the gate of the IGBT during a second turn-on stage that follows the first turn-on stage; means for turning on the turn-on switch means to provide rapid low resistance final charging of the gate of the IGBT to a turn-on voltage supply level during a third turn-on stage that follows the second turn-on stage and for maintaining the turn-on supply voltage level at the gate while the main turn-on signal is present; means for turning off the turn-on switch means and for turning on the turn-off switch means to provide low resistance rapid discharging of the gate of the IGBT during a first turn-off stage after receipt of a main turn-off signal; means for turning on the turn-off controlled current means to provide controlled current discharging of the gate of the IGBT during a second turn-off stage that follows the first turn-off stage; and means for turning on the turn-off switch means to provide rapid low resistance discharging of the gate of the IGBT to a turn-off voltage supply level during a third turn-off stage that follows the second turn-off stage and for maintaining the turn-off voltage level at the gate while the main turn-off signal is present.

17. The gate drive circuit of claim 16 wherein the first turn-on stage continues until the gate threshold voltage of the IGBT is reached whereupon the second turn-on stage is initiated by turning on the turn-on controlled current means.

18. The gate drive circuit of claim 17 wherein the second turn-on stage continues until the collector current of the IGBT reaches the load current plus the peak reverse recovery current whereupon the third turn-on stage is initiated by turning on the turn-on switch means.

19. The gate drive circuit of claim 16 wherein the turn-on switch means includes a turn-on MOSFET switch and a low resistance gate turn-on resistor connected in series between a turn-on gate supply voltage line and a gate input line connected to the gate of the IGBT.

20. The gate drive circuit of claim 19 wherein the gate turn-on resistor has a resistance of less than one ohm.

21. The gate drive circuit of claim 16 wherein the turn-on controlled current means includes a turn-on bipolar junction transistor connected between a turn-on gate supply voltage line and a gate input line connected to the gate of the IGBT.

22. The gate drive circuit of claim 16 wherein the first turn-on stage continues for a selected fixed period of time whereupon the second turn-on stage is initiated by turning on the turn-on controlled current means.

23. The gate drive circuit of claim 16 wherein the second turn-on stage continues until the voltage measured between the Kelvin emitter and the power emitter of the IGBT reaches a selected level.

24. The gate drive circuit of claim 16 wherein the first turn-off stage continues until the collector voltage of the IGBT begins to rise whereupon the second turn-off stage is initiated by turning on the turn-off controlled current means.

25. The gate drive circuit of claim 16 wherein the second turn-off stage continues until the end of the rapid falling of the collector current whereupon the third turn-off stage is initiated by turning on the turn-off switch means.

26. The gate drive circuit of claim 16 wherein the turn-off switch means includes a turn-off MOSFET switch and a low resistance gate turn-off resistor connected in series between a turn-off gate supply voltage line and a gate input line connected to the gate of the IGBT.

27. The gate drive circuit of claim 26 wherein the gate turn-off resistor has a resistance of less than one ohm.

28. The gate drive circuit of claim 16 wherein the turn-off controlled current means includes a turn-off bipolar junction transistor connected between a turn-off supply voltage line and a gate input line connected to the gate of the IGBT.

29. The gate drive circuit of claim 16 wherein the first turn-off stage continues until the gate voltage goes below the threshold gate voltage of the IGBT whereupon the second turn-off stage is initiated by turning on the turn-off controlled current means.

30. A method of turning on an IGBT comprising the steps of:
   (a) rapidly charging the gate of the IGBT through a low resistance during a first stage upon initiation of turn-on;
   (b) during a second stage that follows the first stage providing a controlled charging current to the gate of the IGBT; and
   (c) during a third stage that follows the second stage rapidly charging the gate of the IGBT through a low resistance to a turn-on voltage supply level and maintaining the turn-on voltage supply level at the gate during the time that the IGBT is to be turned on.

31. The method of claim 30 wherein the first stage continues until the gate threshold voltage of the IGBT is reached whereupon the second stage is initiated.

32. The method of claim 30 wherein the second stage continues until the collector current of the IGBT reaches the low current plus the peak reverse recovery current whereupon the third stage is initiated.

33. The method of claim 30 wherein the first stage continues for a selected fixed period of time whereupon the second stage is initiated.

34. A method of turning off an IGBT comprising the steps of:
(a) rapidly discharging the gate of the IGBT through a low resistance during a first stage beginning when the IGBT is to be turned off;
(b) during a second stage that follows the first stage providing controlled current discharge of the gate of the IGBT; and
(c) during a third stage that follows the second stage rapidly finally discharging the gate of the IGBT through a low resistance to a turn-off voltage supply level and maintaining the turn-off voltage level at the gate while the IGBT is to be turned off.

35. The method of claim 34 wherein the first stage continues until the collector voltage of the IGBT begins to rise whereupon the second stage is initiated.

36. The method of claim 34 wherein the second stage continues until the end of the rapid falling of the collector current of the IGBT whereupon the third stage is initiated.

37. The method of claim 34 wherein the first stage continues until the gate voltage of the IGBT goes below the threshold gate of the IGBT whereupon the second stage is initiated.

38. A method of turning on and turning off an IGBT comprising the steps of:
(a) rapidly charging the gate of the IGBT during a first turn-on stage through a low resistance after receipt of a turn-on signal;
(b) during a second turn-on stage that follows the first turn-on stage providing controlled current charging of the gate of the IGBT;
(c) during a third turn-on stage that follows the second turn-on stage rapidly finally discharging the gate of the IGBT to a low resistance to a turn on voltage supply level and maintaining the turn-on supply voltage level at the gate while the turn-on signal is present;
(d) rapidly discharging the gate of the IGBT through a low resistance during a first turn-off stage after receipt of a turn-off signal;
(e) during a second turn-off stage that follows the first turn-off stage providing controlled current discharging of the gate of the IGBT; and
(f) during a third turn-off stage that follows the second turn-off stage rapidly finally discharging the gate of the IGBT through a low resistance to a turn-off voltage supply level and maintaining the turn-off voltage level at the gate while the turn-off signal is present.

39. The method of claim 38 wherein the first turn-on stage continues until the gate threshold voltage of the IGBT is reached whereupon the second turn-off stage is initiated.

40. The method of claim 38 wherein the second turn-off stage continues until the collector current of the IGBT reaches the low current plus the peak reverse recovery current whereupon the third turn-on stage is initiated.

41. The method of claim 38 wherein the first turn-on stage continues for a selected fixed period of time whereupon the second turn-on stage is initiated.

42. The method of claim 38 wherein the second turn-on stage continues until the voltage measured between the Kelvin emitter and the power emitter of the IGBT reaches a selected level.

43. The method of claim 38 wherein the first turn-off stage continues until the collector voltage of the IGBT begins to rise whereupon the second turn-off stage is initiated.

44. The method of claim 38 wherein the second turn-off stage continues until the end of the rapid falling of the collector current of the IGBT whereupon the third turn-off stage is initiated.

45. The method of claim 38 wherein the first turn-off stage continues until the gate voltage goes below the threshold gate voltage of the IGBT whereupon the second turn-off stage is initiated.

46. A gate drive turn-on and turn-off circuit for IGBTs comprising:
(a) a turn-on MOSFET switch and a gate turn-on resistor connected in series between a turn-on supply voltage line and a gate input line;
(b) a turn-on bipolar transistor connected between the turn-on supply voltage line and the gate input line in parallel with the turn-on MOSFET switch and the gate turn-on resistor;
(c) a turn-off MOSFET switch and a gate turn-off resistor connected in series between a turn-off supply voltage line and the gate input line; and
(d) a turn-off bipolar transistor connected between the turn-off supply voltage line and the gate input line in parallel with the turn-off MOSFET switch and the gate turn-off resistor;
whereby control signals may be provided to the turn-on and turn-off MOSFET switches and the turn-on and turn-off bipolar transistors to provide low resistance gate charging and discharging stages through the MOSFET switches and controlled current gate charging and discharging stages through the bipolar transistors.

47. The gate drive turn-on and turn-off circuit for IGBTs of claim 46 further comprising a circuit connected to the MOSFET switches and the bipolar transistors and receiving a main turn-on and turn-off command signal, and including
means for turning on the turn-on MOSFET to provide low resistance rapid charging of the gate of an IGBT during a first turn-on stage after receipt of a main command turn-on signal;
means for turning on the turn-on bipolar transistor to provide controlled current charging of the gate of the IGBT during a second turn-on stage that follows the first turn-on stage;
means for turning on the turning-on MOSFET to provide rapid low resistance final charging of the gate of the IGBT to a turn-on voltage supply level during a third turn-on stage that follows the second turn-on stage and for maintaining the turn-on supply voltage level at the gate while the main turn-on signal is present;
means for turning off the turn-on MOSFET and for turning on the turn-off MOSFET to provide low resistance rapid discharging of the gate of the IGBT during a first turn-off stage after receipt of a main turn-off signal;
means for turning on the turn-off bipolar transistor to provide controlled current discharging of the gate of the IGBT during a second turn-off stage that follows the first turn-off stage; and
means for turning on the turn-off MOSFET to provide rapid low resistance final discharging of the gate of the IGBT to a turn-off voltage supply level during a third turn-off stage that follows the second turn-off stage and for maintaining the turn-off voltage level at the gate while the main turn-off signal is present.

* * * * *